United States Patent

Chen et al.

Patent Number: 5,851,872
Date of Patent: Dec. 22, 1998

[54] METHOD OF FABRICATING DYNAMIC RANDOM ACCESS MEMORY

[75] Inventors: Hwi-Huang Chen; Gary Hong, both of Hsinchu City, Taiwan

[73] Assignee: United Microelectronics Corporation, Taiwan

[21] Appl. No.: 627,128

[22] Filed: Apr. 3, 1996

[51] Int. Cl.⁶ ............................................. H01L 21/8242
[52] U.S. Cl. ..................... 438/253; 438/254; 438/396; 438/397; 438/585
[58] Field of Search ................................. 438/253, 254, 438/396, 397, 585

[56] References Cited

U.S. PATENT DOCUMENTS

| | | | |
|---|---|---|---|
| 5,049,517 | 9/1991 | Liu et al. | 438/254 |
| 5,219,778 | 6/1993 | Dennison et al. | 438/254 |
| 5,223,448 | 6/1993 | Su | 438/253 |
| 5,244,826 | 9/1993 | Gonzalez et al. | 438/254 |
| 5,286,668 | 2/1994 | Chou | 438/254 |
| 5,491,104 | 2/1996 | Lee et al. | 438/254 |
| 5,541,127 | 7/1996 | Hoshiko et al. | 438/585 |
| 5,567,639 | 10/1996 | Chang | 438/397 |
| 5,629,225 | 5/1997 | Iwakiri et al. | 438/254 |

Primary Examiner—John Niebling
Assistant Examiner—Lynne A. Gurley
Attorney, Agent, or Firm—Rabin & Champagne

[57] ABSTRACT

A method of fabricating a DRAM which includes a capacitor and a metal oxide semiconductor field effect transistor. A field oxide layer is formed on a silicon substrate. A gate oxide layer is formed on the silicon substrate. A first polysilicon layer is deposited on the gate oxide layer. An insulator is deposited on the first polysilicon layer. A first silicon nitride layer is deposited on the insulator. The first silicon nitride layer, the insulator, the first polysilicon layer and the gate oxide layer are processed to form a gate electrode. First spacers are formed between the insulator and the substrate on sidewall on opposite sides of the gate electrode. Source-drain regions are formed on the substrate on the opposite sides of the gate electrode. A contact window is formed on the drain electrode. Second spacers are formed on surfaces of the first spacers which are adjacent to the contact window. A second silicon nitride layer is deposited on a surface of the first silicon nitride layer and a surface of the first spacers which are remote from the contact window. A second polysilicon layer is deposited on the contact window as a charge storage electrode of the capacitor. The first silicon nitride layer and the second silicon nitride layer are removed. A dielectric layer is deposited on the surface of the second polysilicon layer. A third polysilicon layer is deposited on the dielectric layer as the cell plate of the capacitor.

16 Claims, 4 Drawing Sheets

METHOD OF FABRICATING DYNAMIC RANDOM ACCESS MEMORY

BACKGROUND OF THE INVENTION

1. Field of the Invention

This invention relates in general to a method of fabricating a dynamic random access memory (DRAM), especially to a method of increasing the charge storage capacity of DRAM by enlarging the capacitance of a DRAM capacitor.

2. Description of the Related Art

As the functions expected of microprocessors have advanced, the need for high capacity memories in order for the microprocessors to perform the massive programs and calculations, is getting stronger. At present, a DRAM cell circuit with a large charge storage capacity consists of an N-type metal oxide semiconductor field effect transistor (MOSFET) 10 and a capacitor 12, as shown in FIG. 1. The gate electrode of the N-type MOSFET 10 is coupled with a word line WL. The drain electrode of N-type MOSFET 10 is coupled with a bit line BL. The source electrode of the N-type MOSFET is coupled with one end of the capacitor 12 and the other end of the capacitor 12 is grounded. As is well known in the art, the N-type MOSFET 10 is a bi-directional switch and the capacitor 12 is used for storing charge.

In FIG. 2, the capacitor structure of a traditional DRAM is shown. Initially, a field oxide layer 21, a gate oxide layer 22, a first polysilicon layer 23, spacer walls 24 and source-drain electrode regions 25 are formed sequentially to construct the necessary structure of a transistor. An oxide layer 26 such as a layer of $SiO_2$ then is deposited. A contact window is formed by etching away the portions of the oxide layer 26 over a prescribed one of the source-drain electrode regions 25, and a second polysilicon 27 layer is deposited on the contact window. A dielectric layer 28 is deposited on the surface of the second polysilicon layer 27. The dielectric layer could be a nitride - oxide (NO) layer or an oxide-nitride-oxide (ONO) layer. Finally, a third polysilicon layer 29 is deposited. The second polysilicon layer 27, the dielectric layer 28 and the third polysilicon layer 29 so formed construct the capacitor in FIG. 2.

If the charge storage capacity of the capacitor is increased, several advantages are achieved. For example:

1. The influence of noise while data is being accessed, such as soft errors produced by α particles, is reduced.

2. The possibility of data loss due to leakage current is reduced.

3. The required refresh frequency is reduced.

SUMMARY OF THE INVENTION

It is therefore an object of the invention to provide a method of fabricating a DRAM so as to increase the charge storage capacity of its capacitor.

It is another object of the invention to provide a method of fabricating a DRAM so as to increase the isolation between the gate electrode and the charge storage electrode of the capacitor.

The invention achieves the above-identified objects by providing a method of fabricating a DRAM of the type that includes a capacitor and a metal oxide semiconductor field effect transistor. According to the method, a field oxide layer is formed on a silicon substrate. A gate oxide layer is formed on the silicon substrate. A first polysilicon layer is deposited on the gate oxide layer. An insulator is deposited on the first polysilicon layer. A first silicon nitride layer is deposited on the insulator. The first silicon nitride layer, the insulator, the first polysilicon layer and the gate oxide layer are processed as by etching to form a gate electrode that includes remaining portions of the gate oxide layer and the first polysilicon layer. First spacers are formed along opposite sidewalls of the insulator and the gate electrode. Source-drain electrodes are formed on the substrate adjacent to opposite sides of the gate electrode. A contact window is formed on one of the source-drain electrodes. A second spacer is formed on the exposed surface of the first spacer which is adjacent to the contact window. A second silicon nitride layer is deposited on the surfaces of the first silicon nitride layer and one of the first spacers, which is remote from the contact window. A second polysilicon layer is deposited on the contact window, the first silicon nitride layer and the second silicon nitride layer as a charge storage electrode of the capacitor. The first silicon nitride layer and the second silicon nitride layer are removed. A dielectric layer is deposited on the surface of the second polysilicon layer. A third polysilicon layer is deposited on the dielectric layer as the cell plate of the capacitor.

In the preferred embodiment, the layout pattern of the lower part of the second polysilicon layer forms a staircase shape above the insulator, so that the area of the second polysilicon layer, i.e., the charge storage electrode, is larger than that of the charge storage electrode of the traditional DRAM, so that its capacitance also is enlarged. Moreover, between the first polysilicon layer and the second polysilicon layer, there are not only the first spacers as are formed in the traditional process, but also the second spacers formed of silicon nitride to improve the insulation between the gate electrode and the charge storage electrode of the capacitor.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1:
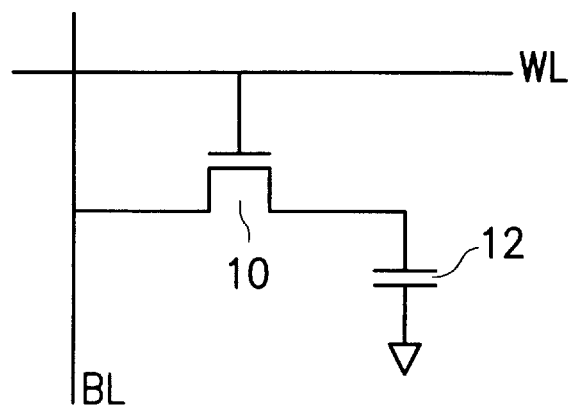
FIG. 1 is a circuit diagram of a conventional DRAM memory cell.
Figure 2:
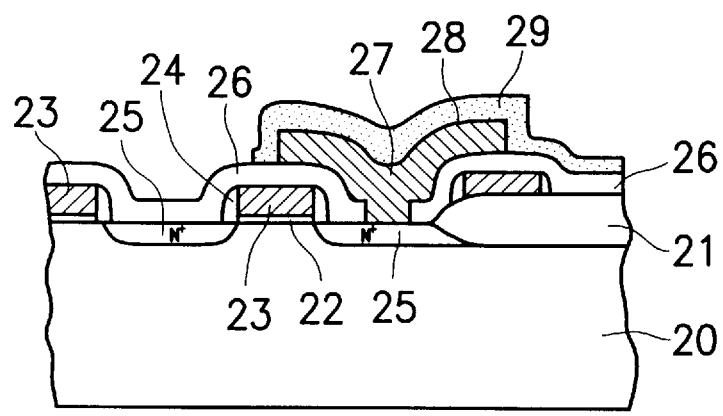
FIG. 2 is a cross-sectional view illustrating the structure of a traditional stack capacitor.
Figure 3A:
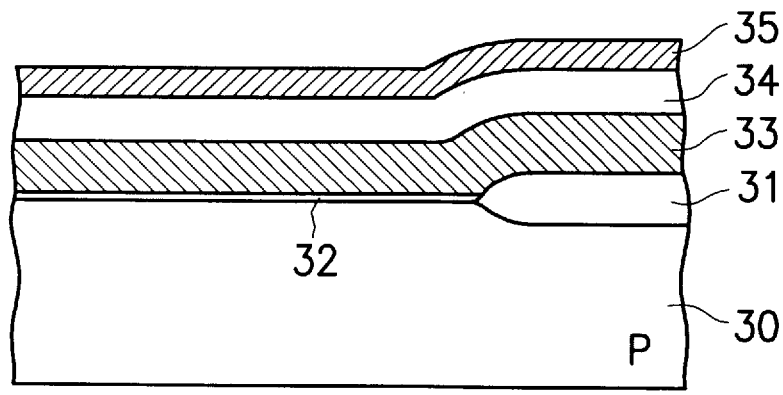
FIGS. 3A–3F are cross-sectional views illustrating a process of manufacturing a DRAM according to the preferred embodiment of the invention.

Referring to FIG. 3A, a substrate 30, such as a P-type substrate, is provided. On the substrate 30, a field oxide layer 31 is formed by local oxidation. A gate oxide layer 32 is deposited by dry oxidation. Then, on the gate oxide layer 32, a first polysilicon layer 33 is formed by chemical vapor deposition (CVD). The thickness of the first polysilicon layer 33 is between about 1500 Å and about 4000 Å. On the first polysilicon layer 33, an insulator 34 is deposited by CVD. The insulator can be an oxide layer, a nitride-oxide (NO) layer or an oxide-nitride-oxide (ONO) layer and the thickness of the insulator is between about 1000 Å and about 3000 Å. Thereafter, a silicon nitride layer 35 is deposited by CVD on the insulator 34 and the thickness of the silicon nitride layer 35 is between about 200 Å and about 2000 Å.

Figure 3B:
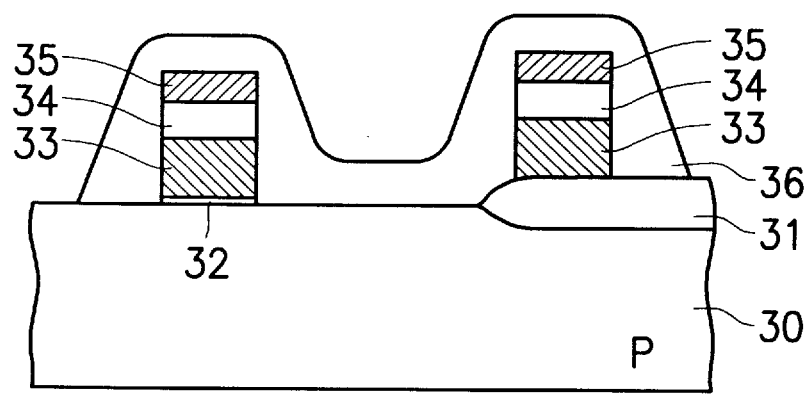

Using a photolithographic technique, a gate electrode is defined as shown in FIG. 3B. At this moment, the first polysilicon layer 33 and the gate oxide layer 32 form the gate electrode, on which the insulator 34 and the silicon nitride layer 35 remain to form a gate structure. Using the first polysilicon layer 33, the insulator 34 and the silicon nitride layer 35 as a mask, low density phosphorus or arsenic ions are implanted into source-drain electrode regions in the P-type substrate 30 to form lightly doped drain (LDD) structures. Later, an oxide layer 36 is deposited by CVD on the surface of the gate structure and the P-type substrate 30. The oxide layer 36 can be replaced by a nitride-oxide (NO) layer or an oxide-nitride-oxide (ONO) layer, and the thickness of the oxide layer 36 is between about 1000 Å and about 3000 Å.

Figure 3C:
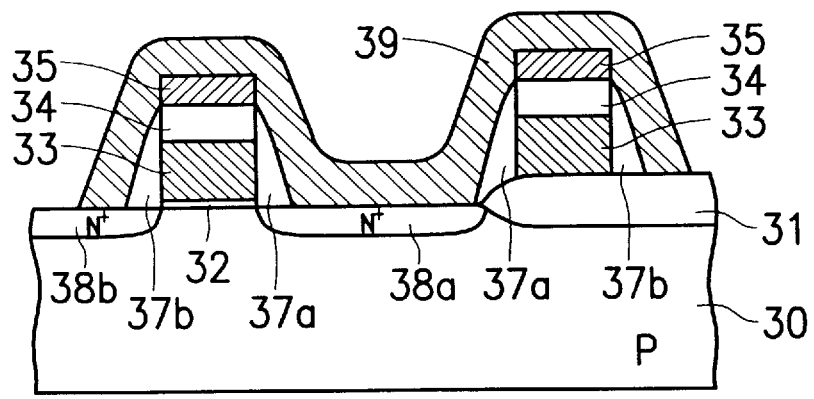

Referring to FIG. 3C, spacers 37a and 37b are formed on the opposite side walls of the gate oxide layer 32, the first polysilicon layer 33 and the insulator 34, by etching back the oxide layer 36. Then, using the first polysilicon layer 33, the insulator layer 34, the silicon nitride layer 35 and the spacers 37a and 37b as a mask, high density arsenic or phosphorus ions are implanted into the source-drain regions by CVD to form a source-drain region 38a and a source-drain region 38b (later respectively to define a drain electrode and a source electrode). Thereafter, a silicon nitride layer 39 is deposited on the surface of the P-type substrate 30, the silicon nitride layer 35 and the spacers 37a and 37b, by CVD. The thickness of the silicon nitride layer 39 is between about 500 Å and about 2000 Å.

Figure 3D:
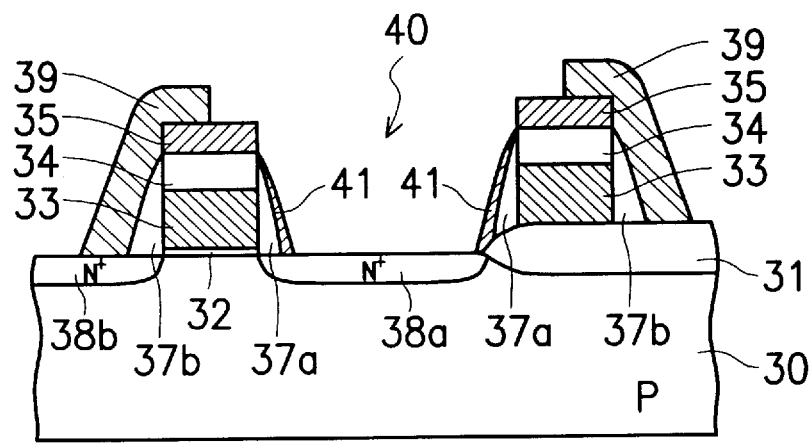

Referring to FIG. 3D, using a photolithographic technique, the silicon nitride layer 39 then is etched to form a contact window 40 on the source-drain region 38a. A portion of the silicon nitride layer 39 is also etch back to expose on a part of the silicon nitride layer 35 adjacent to the contact window 40, and to form spacers 41 between the contact window 40 and the spacers 37a that cover the spacers 37a.

Figure 3E:
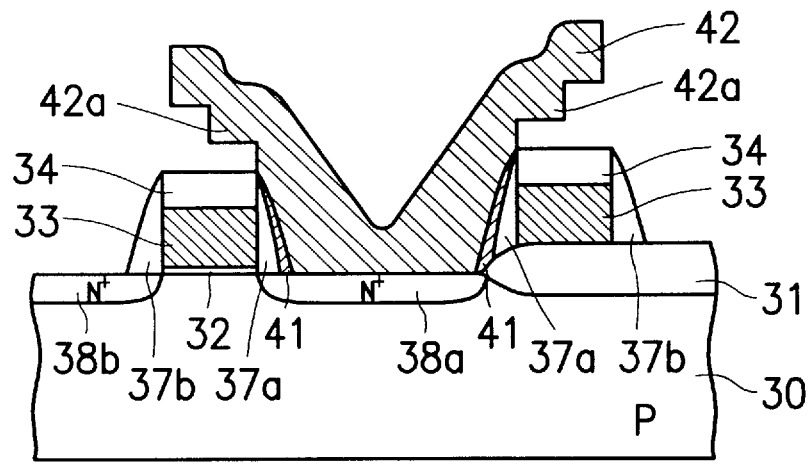

Referring to FIG. 3E, a second polysilicon layer 42 is deposited on the contact window 40 and portions of the silicon nitride layers 35 and 39 over the insulator 34, by CVD. The thickness of the second polysilicon layer 42 is between about 1000 Å and about 5000 Å. Again, using a photolithographic technique, the second polysilicon layer 42 as shown is etched to form a charge storage electrode. A solvent which will dissolve silicon nitride but will not dissolve oxide, such as phosphoric acid, is used to remove the silicon nitride layer 35 and the other silicon nitride layer 39. As a result, above the insulator 34 the lower surface 42a of the second polysilicon layer 42 will have a staircase shape, as shown in FIG. 3E.

Figure 3F:
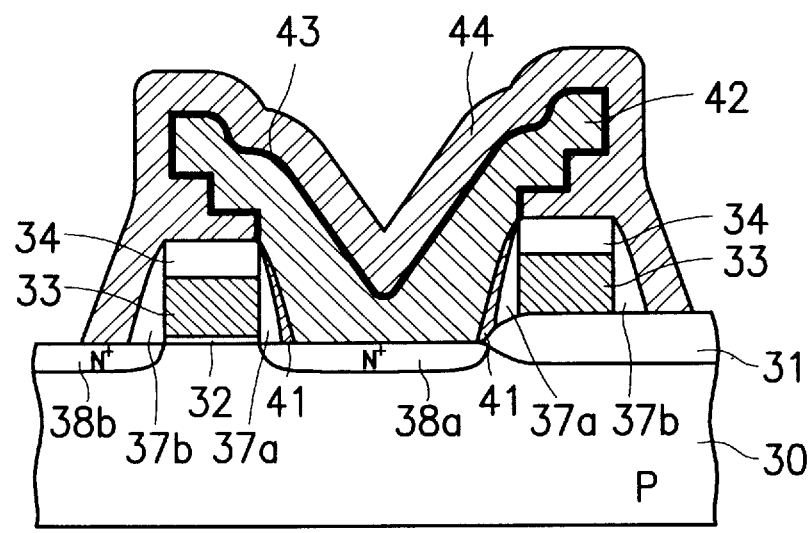

Referring to FIG. 3F, a dielectric layer 43 is deposited by CVD on the exposed surface of second polysilicon layer 42. The dielectric layer 43 can be a nitride-oxide (NO) layer or an oxide-nitride-oxide (ONO) layer and the thickness of the dielectric layer is between about 50 Å and about 90 Å. Subsequently, a third polysilicon layer 44 is deposited by CVD on the surface of the dielectric layer 43. The third polysilicon layer 44 is etched to form a cell plate by again using a photolithographic technique. At this moment, a capacitor as shown is formed by the second polysilicon layer 42, the dielectric layer 43, and the third polysilicon layer 44. Subsequent manufacturing processes are the same as those well known for conventional DRAM manufacturing processes, and therefore will not be further discussed.

As noted above, the following general approaches are known to increase the charge storage capacity of a capacitor:

1. The dielectric constant of dielectric layer is enlarged to increase the charge storage capacity per unit area of the capacitor.
2. Reduce the thickness of the dielectric layer.
3. Increasing the surface area of the capacitor to increase the total charge storage capacity of the capacitor.

As described above, since the layout pattern of the lower part of the second polysilicon layer 42 will form a staircase shape above the insulator 34, the area of the second polysilicon layer 42, i.e., charge storage electrode, will be larger than that of a capacitor charge storage electrode on a conventional DRAM, so as to increase its capacitance over that of the conventional DRAM. Thus, the invention uses the third approach listed above to increase the charge storage capacity of the DRAM capacitor. Moreover, between the first polysilicon layer 33 and the second polysilicon layer 42, there are not only the spacers 37 which are used in the conventional process, but also the spacers 41 formed of silicon nitride, to improve the insulation between the gate electrode and the charge storage electrode of the capacitor.

While the invention has been described by way of example and in terms of a preferred embodiment, it is to be understood that the invention is not limited to the disclosed embodiment. To the contrary, it is intended to cover various modifications and similar arrangements included within the spirit and scope of the invention and the scope of the appended claims should be accorded the broadest interpretation so as to encompass all such modifications and similar structures.

What is claimed is:

1. A method of fabricating dynamic random access memory that includes a capacitor and a metal oxide semiconductor field effect transistor, comprising the steps of
   (a) forming a field oxide layer on a silicon substrate;
   (b) forming a gate oxide layer on the silicon substrate;
   (c) depositing a first polysilicon layer on the gate oxide layer;
   (d) depositing an insulator on the first polysilicon layer;
   (e) depositing a first silicon nitride layer on the insulator;
   (f) processing the first silicon nitride layer, the insulator, the first polysilicon layer and the gate oxide layer to form a gate electrode having first and second sidewalls at respective opposite first and second sides thereof;
   (g) forming first spacers on the first and second sidewalls;
   (h) forming first and second source-drain regions on the substrate respectively beside the first and second sides of the gate electrode;
   (i) forming a contact window on the first source-drain regions;
   (j) forming a second spacer on a surface of the first spacer on the first sidewall, adjacent to the contact window;
   (k) depositing a second silicon nitride layer on a surface of the first silicon nitride layer, and on the first spacer on the second sidewall;
   (l) depositing a second polysilicon layer on the contact window, the second spacer, the first silicon nitride layer, and the second nitride layer, as a charge storage electrode of the capacitor;
   (m) removing the first silicon nitride layer and the second silicon nitride layer;
   (n) depositing a dielectric layer on the second polysilicon layer; and
   (o) depositing a third polysilicon layer on the dielectric layer as a cell plate of the capacitor.

2. A method according to claim 1, wherein the first polysilicon layer in said step (c) has a thickness between about 1500 Å and about 4000 Å.

3. A method according to claim 1, wherein the insulator in said step (d) has a thickness between about 1000 Å and about 3000 Å.

4. A method according to claim 3, wherein the insulator is an oxide-nitride-oxide layer.

5. A method according to claim 3, wherein the insulator is a nitride-oxide layer.

6. A method according to claim 1, wherein the first silicon nitride layer in said step (e) has a thickness between about 200 Å and about 2000 Å.

7. A method according to claim 1, wherein the first spacers in said step (g) are made of oxide.

8. A method according to claim 1, wherein the source-drain regions in said step (h) have an LDD structure.

9. A method according to claim 1, wherein the second spacers in said step (j) are made of silicon nitride.

10. A method according to claim 1, wherein the second silicon nitride layer in said step (k) has a thickness between about 500 Å and about 2000 Å.

11. A method according to claim 1, wherein the second polysilicon layer in said step (l) has a thickness between about 1000 Å and about 5000 Å.

12. A method according to claim 1, wherein said step (m) includes the step of applying phosphoric acid to the first silicon nitride layer and the second silicon nitride layer.

13. A method according to claim 1, wherein the dielectric layer in said step (n) is an oxide-nitride-oxide layer.

14. A method according to claim 1, wherein the dielectric layer in said step (n) is a nitride-oxide layer.

15. A method according to claim 1, wherein said step (k) includes the step of depositing the second silicon nitride layer on only a portion of the surface of the first silicon nitride layer remote from the contact window, so that a portion of the surface of the first silicon nitride layer adjacent to the contact window remains exposed.

16. A method according to claim 15, wherein said step (l) includes the step of forming a staircase-shaped portion of the second polysilicon layer on the second silicon nitride layer and the exposed portion of the first silicon nitride layer.

* * * * *